United States Patent
Sun

(10) Patent No.: US 9,673,421 B2
(45) Date of Patent: Jun. 6, 2017

(54) OLED DISPLAY AND MANUFACTURING METHOD THEREOF

(71) Applicant: BOE TECHNOLOGY GROUP CO., LTD., Beijing (CN)

(72) Inventor: Liang Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 61 days.

(21) Appl. No.: 14/436,014

(22) PCT Filed: Aug. 7, 2014

(86) PCT No.: PCT/CN2014/083914
§ 371 (c)(1),
(2) Date: Apr. 15, 2015

(87) PCT Pub. No.: WO2015/161584
PCT Pub. Date: Oct. 29, 2015

(65) Prior Publication Data
US 2016/0254493 A1    Sep. 1, 2016

(30) Foreign Application Priority Data

Apr. 25, 2014  (CN) .......................... 2014 1 0171612

(51) Int. Cl.
*H01L 21/00*     (2006.01)
*H01L 51/52*     (2006.01)
(Continued)

(52) U.S. Cl.
CPC ...... *H01L 51/5265* (2013.01); *H01L 27/3248* (2013.01); *H01L 27/3258* (2013.01);
(Continued)

(58) Field of Classification Search
None
See application file for complete search history.

(56) References Cited

FOREIGN PATENT DOCUMENTS

| CN | 1717135 A   | 1/2006 |
|----|-------------|--------|
| CN | 101750778 A | 6/2010 |

(Continued)

OTHER PUBLICATIONS

Jan. 26, 2015—International Search Report and Written Opinion with Eng Tran.

(Continued)

*Primary Examiner* — Ashok Patel
(74) *Attorney, Agent, or Firm* — Banner & Witcoff, Ltd.

(57) ABSTRACT

An organic light-emitting diode (OLED) display and a manufacturing method thereof are provided. The OLED display includes a plurality of sub-pixel units each including a first region and a second region. The first region includes a first electrode, a first organic material functional layer and a second electrode disposed in order on a base substrate. The second region includes a third electrode, a second organic material functional layer and a fourth electrode disposed in order on the base substrate. The first electrode and the third electrode each include an opaque metal layer, and the second electrode and the fourth electrode are translucent metal electrodes. The first electrode, the first organic material functional layer and the second electrode constitute a first micro-cavity, the third electrode, the second organic material functional layer and the fourth electrode constitute a second micro-cavity, and the first micro-cavity and the second micro-cavity have different micro-cavity effects.

17 Claims, 5 Drawing Sheets

(51) Int. Cl.
*H01L 51/56* (2006.01)
*H01L 27/32* (2006.01)

(52) U.S. Cl.
CPC ...... *H01L 27/3262* (2013.01); *H01L 51/5218* (2013.01); *H01L 51/5221* (2013.01); *H01L 51/56* (2013.01); *H01L 27/3211* (2013.01); *H01L 51/5209* (2013.01); *H01L 51/5225* (2013.01); *H01L 2227/323* (2013.01); *H01L 2251/301* (2013.01); *H01L 2251/308* (2013.01); *H01L 2251/5315* (2013.01)

(56) References Cited

FOREIGN PATENT DOCUMENTS

| | | |
|---|---|---|
| CN | 102184937 A | 9/2011 |
| CN | 102315243 A | 1/2012 |
| CN | 102754236 A | 10/2012 |
| CN | 203787435 U | 8/2014 |

OTHER PUBLICATIONS

Dec. 18, 2014—(CN) First Office Action—App CN 201410171612.7.
Feb. 13, 2015—(CN) Second Office Action—App CN 201410171612.7.
May 5, 2015—(CN) Notice of Allowance—App CN 201410171612.7.

US 9,673,421 B2

OLED DISPLAY AND MANUFACTURING METHOD THEREOF

The application is a U.S. National Phase of International Application No. PCT/CN2014/083914 filed Aug. 7, 2014, designating the United States of America and claiming priority to Chinese Patent Application No. 201410171612.7 filed on Apr. 25, 2014. The present application claims priority to and the benefit of the above-identified applications and the above-identified applications are incorporated by reference herein in their entirety.

TECHNICAL FIELD

Embodiments of the present invention relate to an organic light emitting diode (OLED) display and a manufacturing method thereof.

BACKGROUND

Organic light emitting diode (OLED) is an organic film electroluminescent device with advantages such as simple fabrication process, low costs, easy formation of a flexible structure and a wide viewing angle. Therefore, the display technology utilizing organic light emitting diodes has become an important display technology.

At present, the light extraction efficiency of OLED displays is very low. The key reason is that the organic substance has a reflectivity higher than that of glass and air, while glass has a reflectivity higher than that of air, and therefore light emitted by the luminescent layer suffers from total reflection when traveling to the glass and air, resulting in absorption of partial light by the metal electrode. In order to solve this problem, micro-cavity top-emitting OLED displays have been developed, this structure changes light distribution by virtue of the multi-light interference phenomenon inside the organic layer to increase the light extraction efficiency.

SUMMARY

At least one embodiment of the present invention provides an OLED display and a manufacturing method thereof that allow the display to have optimal light extraction efficiency and viewing angle characteristics.

At least one embodiment of the present invention provides an OLED display including a plurality of sub-pixel units each including a first region and a second region. The first region includes a first electrode, a first organic material functional layer and a second electrode disposed in order on a base substrate. the second region includes a third electrode, a second organic material functional layer and a fourth electrode disposed in order on the base substrate. Both the first electrode and the third electrode comprise opaque a metal layer, and both the second electrode and the fourth electrode are translucent metal electrodes. The first electrode, the first organic material functional layer and the second electrode constitute a first micro-cavity, the third electrode, the second organic material functional layer and the fourth electrode constitute a second micro-cavity, and the first micro-cavity and the second micro-cavity have different micro-cavity effects.

At least one embodiment of the present invention provides a manufacturing method of an OLED display including a plurality of sub-pixel units; the method including: forming a first electrode and a third electrode on a base substrate in a first region and a second region of each of the sub-pixel units respectively; the first electrode and the third electrode both comprising an opaque metal layer; Forming a first organic material functional layer and a second organic material functional layer in the first region and the second region respectively on the substrate formed with the first electrode and the third electrode, and Forming a second electrode and a fourth electrode in the first region and the second region respectively on the substrate formed with the first organic material functional layer and the second organic material functional layer, the second electrode and the fourth electrode both being translucent metal electrodes. The first electrode, the first organic material functional layer and the second electrode constitute a first micro-cavity, the third electrode, the second organic material functional layer and the fourth electrode constitute a second micro-cavity, and the first micro-cavity and the second micro-cavity have different micro-cavity effects.

BRIEF DESCRIPTION OF DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

REFERENCE NUMERALS

Figure 1:
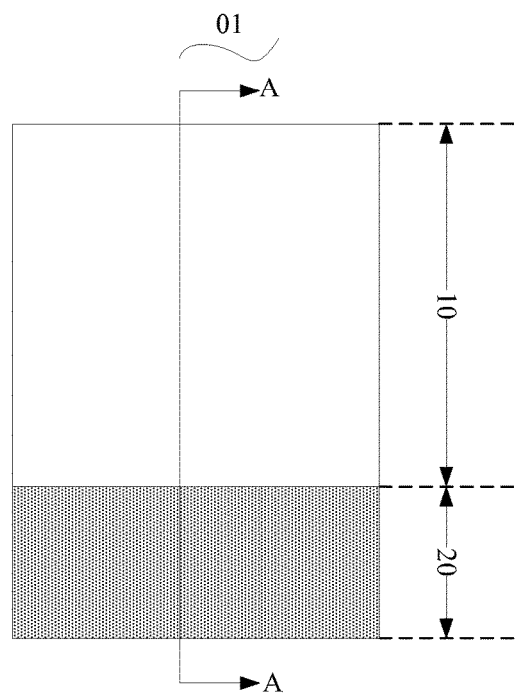
FIG. 1 is a schematic top view of a sub-pixel unit of an OLED display provided in an embodiment of the present invention.

01—Sub-pixel unit; 10—First region; 20—Second region; 100—Base substrate; 101—First electrode; 102—First organic material functional layer; 103—Second electrode; 201—Third electrode; 202—Second organic material functional layer; 203—Fourth electrode; 300—Planarization layer; 400—Thin film transistor; 500—Buffer layer; 600—Encapsulation layer.

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventors of the present application have noted that an OLED display typically implements regulation of strength of micro-cavity effect by adjusting the thickness from cathode to anode. However, if the micro-cavity effect is weak, the regulation of light extraction efficiency is not obvious, or even the light extraction efficiency becomes worse. If the micro-cavity effect is too strong, despite of the obvious regulation of light extraction efficiency, the viewing angle characteristics of the display become worse, and the intensity and color of light would be different at different viewing angles.

At least one embodiment of the present invention provides an OLED display as shown in FIGS. 1 to 10, including a plurality of sub-pixel units 01 each including a first region 10 and a second region 20. The first region 10 includes a first electrode 101, a first organic material functional layer 102 and a second electrode 103 disposed in order on a base substrate 100. The second region 20 includes a third electrode 201, a second organic material functional layer 202 and a fourth electrode 203 disposed in order on the base substrate 100.

Both the first electrode 101 and the third electrode 201 include an opaque a metal layer, and both the second electrode 103 and the fourth electrode 203 are translucent metal electrodes. The first electrode 101, the first organic material functional layer 102 and the second electrode 103 constitute a first micro-cavity, the third electrode 201, the second organic material functional layer 202 and the fourth electrode 203 constitute a second micro-cavity, and the first micro-cavity and the second micro-cavity have different micro-cavity effects.

The first electrode 101 and the third electrode 201 may include an opaque metal layer and indium tin oxide (ITO) layers disposed on both sides of the opaque metal layer. This structure enables the first electrode 101 and the third electrode 201 to match the organic material functional layer over it in terms of energy level and helps to inject carriers in the first electrode 101 and the third electrode 201 into the luminescent layer of the organic material functional layer.

The second electrode 103 and the fourth electrode 203 may be a silver conducting layer with a relatively small thickness.

It is to be noted that, first of all, the first electrode 101 in the first region 10 and the third electrode 201 in the second region 20 may be anodes, and the second electrode 103 in the first region 10 and the fourth electrode 203 in the second region 20 may be cathodes. Alternatively, the first electrode 101 and the third electrode 201 may be cathodes, and the second electrode 103 and the fourth electrode 203 may be anodes.

As for the first organic material functional layer 102 in the first region 10 and the second organic material functional layer 202 in the second region 20, they can include at least an electron transport layer, a luminescent layer and a hole transport layer. Based on this configuration, in order to enhance the efficiency of injecting electrons and holes into the luminescent layer, the above-mentioned organic material functional layer may further include an electron injection layer, disposed between the cathode and the electron transport layer, and a hole injection layer, disposed between the hole transport layer and the anode.

Based on this, while applying an operation voltage across the anode and the cathode, holes in the anode and electrons in the cathode are both injected into the luminescent layer. Holes and electrons meet in the luminescent layer to recombine to form electron-hole pairs, and are excited then to release energy. The energy is given off in form of light, appears as light in different colors emitted by different luminescent molecules in the luminescent layer and exits homogeneously from both sides of the organic material functional layer.

For example, the luminescent layers of three sub-pixel units 01 in one pixel unit may include red, green and blue luminescent molecules respectively. Of course, the above-mentioned luminescent layer may also include only white luminescent molecules, which is not limited herein. These organic luminescent materials may be a fluorescent luminescent material, a phosphorescent luminescent material, or a mixture of both.

Secondly, considering that for the first region 10 or the second region 20, the luminescent layers in the first organic material functional layer 102 and the second organic material functional layer 202 can emit light only when the first electrode 101 and the second electrode 103, the third electrode 201 and the fourth electrode 203 are in operation, and the first region 10 and the second region 20 belong to the same sub-pixel unit 01, in at least one embodiment of the present invention, it is possible to electrically connect the first electrode 101 and the third electrode 103, and electrically connect the second electrode 201 and the fourth electrode 203. For convenient fabrication, the layers in the first organic material functional layer 102 and the layers in the second organic material functional layer 202 may be formed at the same time.

Thirdly, the micro-cavity effect mainly means that the density redistribution of photons with different energy states such that only light of a specific wavelength conforming to a cavity mode can exit at a certain angle.

Thus the first region 10 and the second region 20 are endowed with different light extraction efficiencies and viewing angle characteristics by regulating parameters in the first micro-cavity and the second micro-cavity that influence the micro-cavity effect, for example, reasonably setting the thicknesses of the first micro-cavity and the second micro-cavity, and reflectivity of the first electrode 101 in the first micro-cavity and the third electrode 201 in the second micro-cavity. Based on this, it is possible to implement regulation of the light extraction efficiency and viewing angle characteristic of the sub-pixel unit 01 by adjusting the ratio between and the positions of the first region 10 and the second region 20, thereby endowing the OLED display with the optimal light extraction efficiency and viewing angle characteristics.

Fourthly, the OLED display may be a passive matrix display or an active matrix display, which is not limited herein.

Fifthly, the accompanying drawings for all embodiments of the present invention schematically depict patterned layers related to the spirit of the invention, and do not depict or only depict partial patterned layers irrelevant to the spirit.

At least one embodiment of the present invention provides an OLED display including a plurality of sub-pixel units 01 each including a first region 10 and a second region 20. The first region 10 includes a first electrode 101, a first organic material functional layer 102 and a second electrode 103 disposed in order on a base substrate 100. The second region 20 includes a third electrode 201, a second organic material functional layer 202 and a fourth electrode 203 disposed in order on the base substrate 100. Both the first electrode 101 and the third electrode 201 include an opaque a metal layer, and both the second electrode 103 and the fourth electrode 203 are translucent metal electrodes. The first electrode 101, the first organic material functional layer 102 and the second electrode 103 constitute a first micro-cavity; the third electrode 201, the second organic material functional layer 202 and the fourth electrode 203 constitute a second micro-cavity, and the first micro-cavity and the second micro-cavity have different micro-cavity effects.

The first region 10 and the second region 20 are endowed with different light extraction efficiency and viewing angle characteristics by adjusting parameters in the first micro-cavity and the second micro-cavity that influence the micro-cavity effect. Based on this, it is possible to implement regulation of the light extraction efficiency and viewing angle characteristics of the sub-pixel unit 01 by reasonably setting the ratio between the first region 10 and the second region 20 and the positions of them, thereby endowing the OLED display with the optimal light extraction efficiency and viewing angle characteristics.

Figure 2:
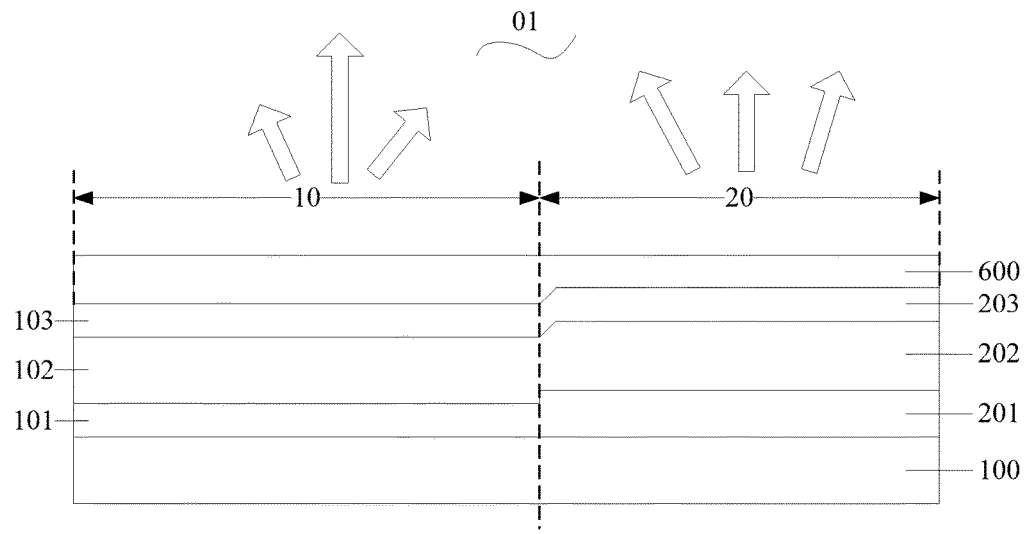
FIG. 2 is a schematic cross section view I in AA direction of a sub-pixel unit of an OLED display provided in an embodiment of the present invention.

In at least one embodiment of the present invention, as shown in FIG. 2, the first micro-cavity has a thickness different from that of the second micro-cavity.

The thickness of the micro-cavity and the peak wavelength of the luminescent spectrum of the micro-cavity may satisfy the following relationship:

$$L = m\frac{\lambda_m}{2};$$

where m is the order of the emitting film; $\lambda_m$ is the wavelength of the film of order m.

As can be known from the above description, it is possible to change the position of emission mode order "m" and the emission wavelength of the micro-cavity by adjusting the thickness of the micro-cavity, thereby shifting the central wavelength of the electroluminescence spectrum, hence changing the light extraction efficiency. Based on this, the light extraction efficiency and the viewing angle characteristics of the sub-pixel unit 01 can be balanced by adjusting the thicknesses of the first micro-cavity and the second micro-cavity.

Here, for example, the thickness of the first micro-cavity is regulated by adjusting the thickness of the first electrode 101, and the thickness of the second micro-cavity is regulated by adjusting the thickness of the third electrode 201.

In at least one embodiment of the present invention, the first electrode 101 and the third electrode 201 have different reflectivity.

Since the micro-cavity effect primarily relates to a multi-light interference phenomenon formed by multiple reflections of light between two electrodes and enhancing light extraction efficiency by changing light distribution, it is possible to reasonably set the reflectivity of reflecting electrodes, namely reflectivity of the first electrode 101 and third electrode 201 to, for example, endow the first region 10 with a high light extraction efficiency and use the second region 20 guarantee the viewing angle characteristic, thereby achieving an optimal balanced state of light extraction efficiency and viewing angle characteristic of the sub-pixel unit 01.

Figure 3:
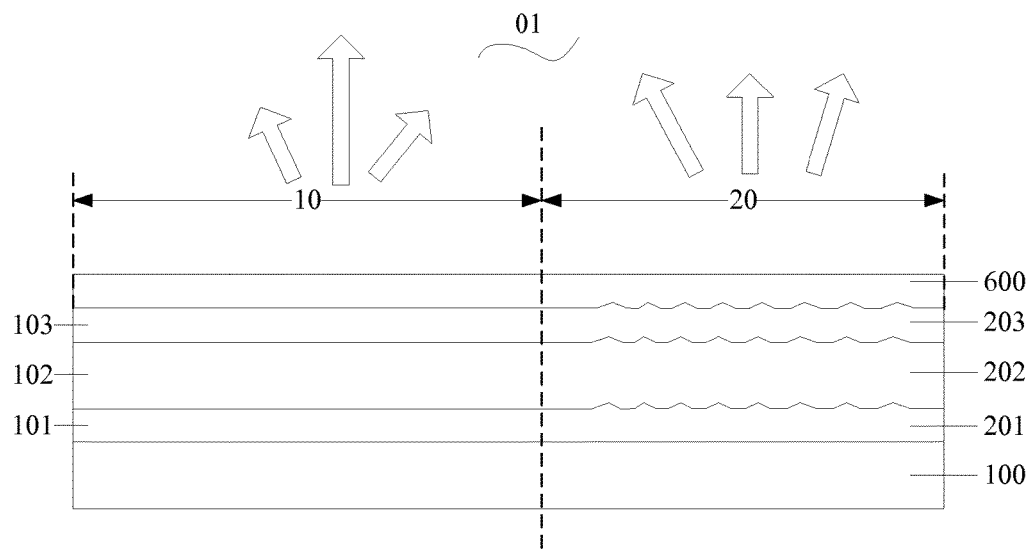
FIG. 3 is a schematic cross section view II in AA direction of a sub-pixel unit of an OLED display provided in an embodiment of the present invention.
Figure 4:
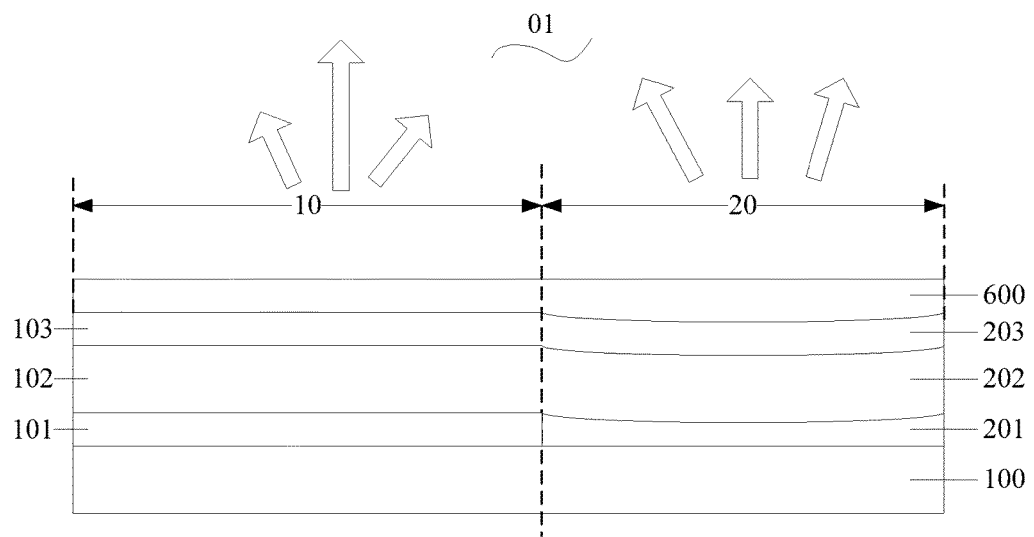
FIG. 4 is a schematic cross section view III in AA direction of a sub-pixel unit of an OLED display provided in an embodiment of the present invention.
Figure 5:
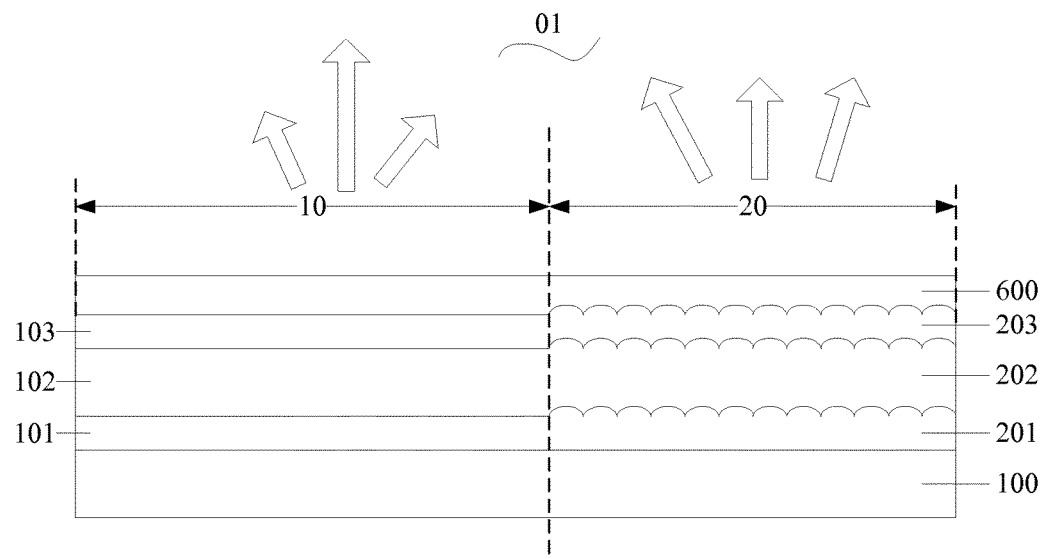
FIG. 5 is a schematic cross section view IV in AA direction of a sub-pixel unit of an OLED display provided in an embodiment of the present invention.

In at least one embodiment of the present invention, it is possible to make the first electrode 101 and the third electrode 201 have different reflectivity by changing shapes of the top surface of the first electrode 101 that contacts the first organic material functional layer 102 and the top surface of the third electrode 201 that contacts the second organic material functional layer 202. That is, as shown in FIGS. 3 to 5, it is possible to set the top surface of the first electrode 101 that contacts the first organic material functional layer 102 as a plane, and set the top surface of the third electrode 201 that contacts the second organic material functional layer 202 as a non-planar surface.

In this way, by setting the top surface of the third electrode 201 that contacts the second organic material functional layer 202 to be a non-planar surface, it can cause the light emitted from the luminescent layer of the second organic material functional layer 202 to generate multiple-beam interference in directions between the third electrode 201 and fourth electrode 203, and enable light of different angles to exit, thereby guaranteeing its viewing angle characteristics; while by setting the top surface of the first electrode 101 that contacts the first organic material functional layer 102 to be a plane, it can guarantee the intensity of its emergent light. Combining both of them, it is possible to achieve an optimal balanced state of light extraction efficiency and viewing angle characteristics of the sub-pixel unit 01.

Base on this, the process of setting the top surface of the third electrode 201 that contacts the second organic material functional layer 202 to be a non-planar surface may be implemented in the following ways.

The first way. As shown in FIG. 3, the top surface of the third electrode 201 that contacts the second organic material functional layer 202 is formed with certain roughness. The value of roughness may be set according to practical situations.

The second way. As shown in FIGS. 4 and 5, the top surface of the third electrode 201 that contacts the second organic material functional layer 202 is formed into an uneven shape. Here, the uneven shape may be for example in arcs, waves and corrugated shape.

Figure 6:
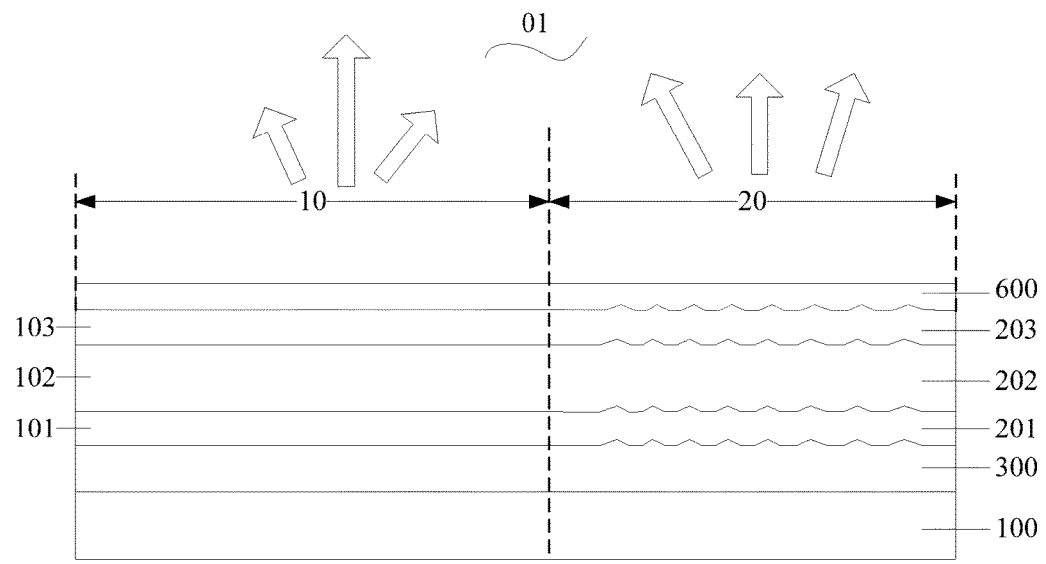
FIG. 6 is a schematic cross section view I in AA direction of a sub-pixel unit of an OLED display including a planarization layer provided in an embodiment of the present invention.
Figure 7:
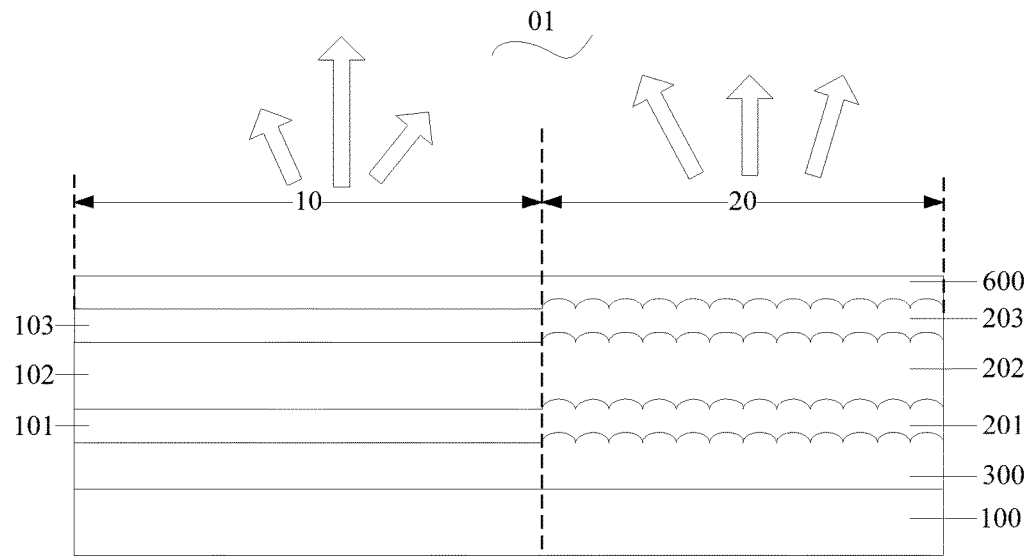
FIG. 7 is a schematic cross section view II in AA direction of a sub-pixel unit of an OLED display including a planarization layer provided in an embodiment of the present invention.

In at least one embodiment of the present invention, as shown in FIGS. 6 and 7, in the above-mentioned ways, it is possible to form the top surface of the third electrode 201 into a non-planar shape by providing a planarization layer 300 between the base substrate 100 and the first electrodes 101 as well as the third electrode 201. That is, it is possible to configure the top surface of the planarization layer 300 under the third electrode 201 with a roughness of predetermined amount or an uneven shape.

This is because the planarization layer 300 is located under the first electrode 101 and third electrode 201, that is, the underlying planarization layer 300 needs to be formed firstly, and then the upper first electrode 101 and third electrode 201 are formed. Therefore, if the top surface of the planarization layer 300 under the third electrode 201 has certain roughness or a particular shape, the third electrode 201 formed thereon also have certain roughness or a particular shape, and in like manner, the second organic material functional layer 202 and the fourth electrode 203 over the third electrode 201 also have certain roughness or a particular shape.

Figure 8:
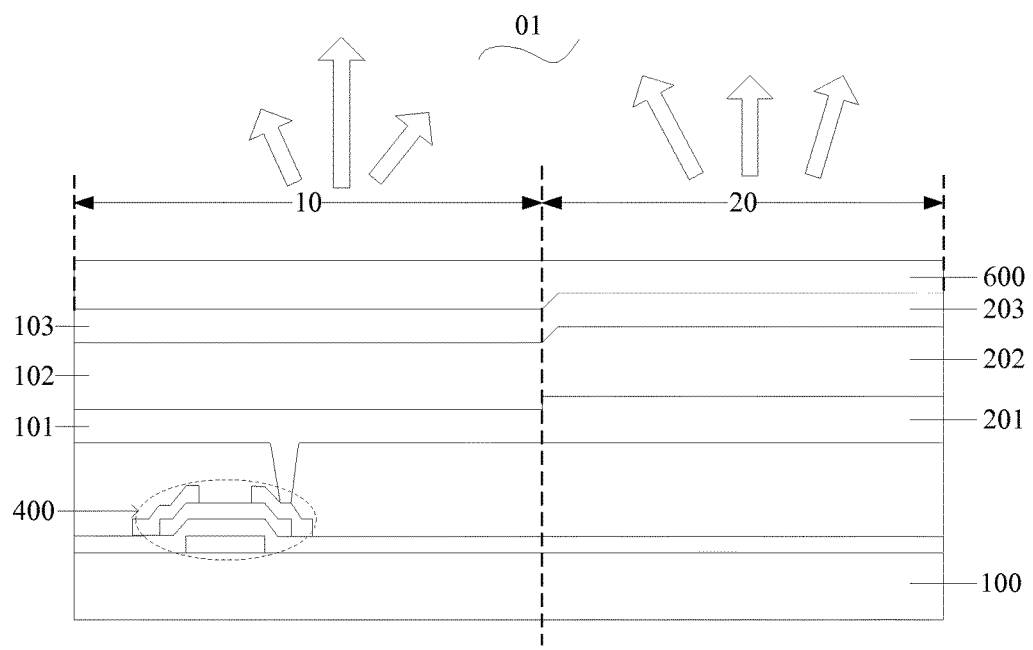
FIG. 8 is a schematic cross section view I in AA direction of a sub-pixel unit of an OLED display including thin film transistors provided in an embodiment of the present invention.
Figure 9:
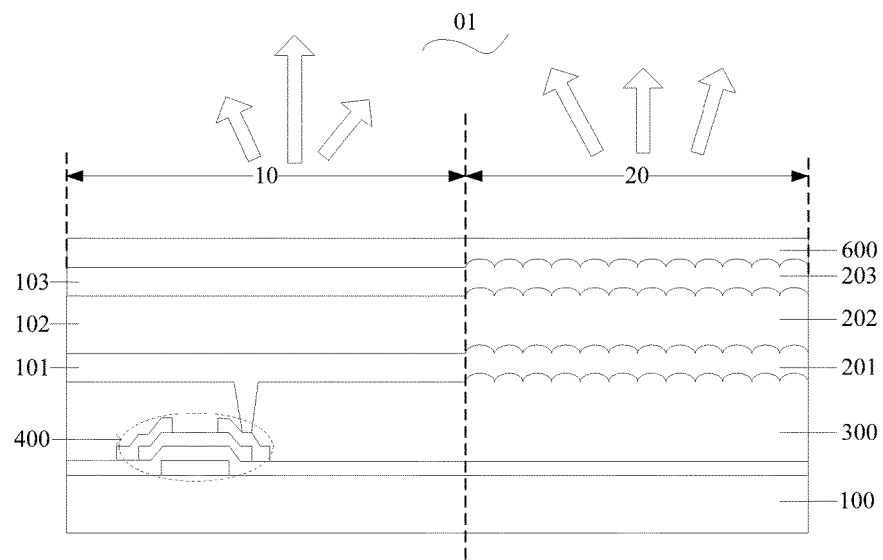
FIG. 9 is a schematic cross section view II in AA direction of a sub-pixel unit of an OLED display including thin film transistors provided in an embodiment of the present invention.

Further, considering that passive matrix driving has deficient aspects when it is applied to large-sized displays, in at least one embodiment of the present invention, the OLED display provided in an embodiment of the present invention is an active matrix type OLED display. That is, as shown in FIGS. 8 and 9, each sub-pixel unit 01 of the OLED display may further include a thin film transistor 400 disposed between the base substrate 100 and the first electrode 101 or the third electrode 201. The thin film transistor 400 includes a gate electrode, a gate insulating layer, a semiconductor active layer, a source electrode and a drain electrode. Based on this, the OLED display further includes gate lines, gate line leads (not shown in drawings) electrically connected with the gate electrodes, and data lines, data line leads (not shown in figures) electrically connected with the source electrodes.

It is to be noted that the thin film transistor 400 may be of a top gate type or a bottom gate type, and the present invention is not limited thereto.

In addition to the structures as shown in FIGS. 8 and 9, the thin film transistor 400 may also be disposed on the encapsulation layer and the drain electrode of the thin film transistor 400 is electrically connected with the anode or cathode of the luminescent unit on the base substrate.

Furthermore, in the case that the first electrode 101 and the third electrode 201 are electrically connected, and the second electrode 103 and the fourth electrode 203 are electrically connected, in order to electrically connect the drain electrode with the second electrode 103, it is necessarily required to electrically connect the second electrode 103 with the drain electrode through both the first organic material functional layer 102 and the first electrode 101. This could result in short circuit between the second electrode 103 and the first electrode 101 on one hand, and on the other hand, the manufacturing process is relatively complex due to the material property of the organic material functional layer. In view of this, in at least one embodiment of the present invention, the drain electrode directly contacts the first electrode 101 or the third electrode 201. As shown in FIG. 9, in the case that the OLED display includes a planarization layer 300 under the first electrode 101 and the third electrode 201, it is required to electrically connect the first electrode 101 or the third electrode 201 with the drain electrode of the thin film transistor 400 through via holes formed in the planarization layer 300.

Figure 10:
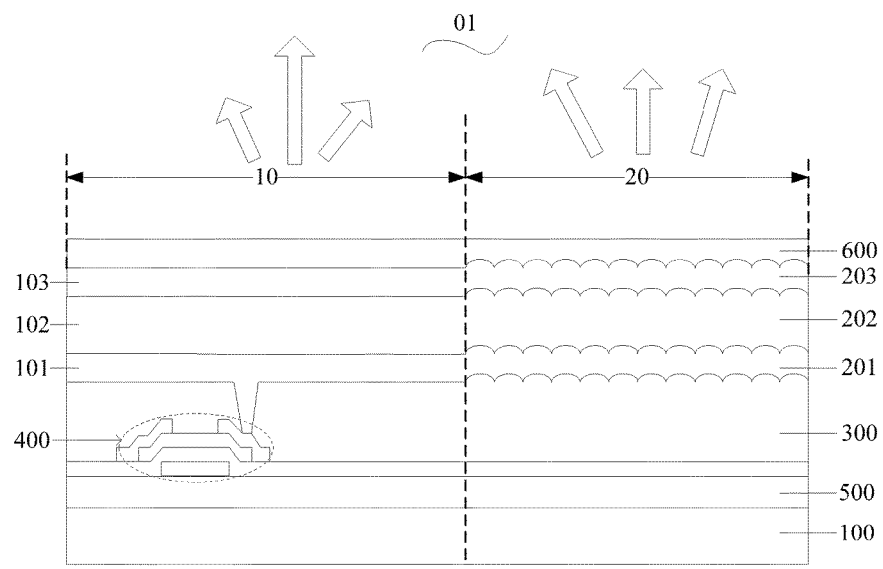
FIG. 10 is a schematic cross section view in AA direction of a sub-pixel unit of an OLED display including a buffer layer provided in an embodiment of the present invention.

In at least one embodiment of the present invention, as shown in FIG. 10, the OLED display further includes a buffer layer 500 disposed between the base substrate 100 and the thin film transistor 400, and the buffer layer 500 contacts the base substrate 100.

The buffer layer 500 may be of a single-layer or multi-layer structure and may be formed of a material, for example, SiN (silicon nitride) or SiOx (silicon oxide).

The buffer layer 500 helps to improve the smoothness and adhesion of the surface of the base substrate 10, and improve the anti-permeability against water and oxygen.

It is to be noted that due to the material property of the organic material functional layer, in at least one embodiment of the present invention, the OLED display should further include an encapsulation layer 600 for encapsulating organic material; the encapsulation layer 600 may be of a film encapsulation type or a substrate encapsulation type, which is not limited herein.

At least one embodiment of the present invention further provides a manufacturing method of an OLED display including a plurality of sub-pixel units. Referring to FIG. 2, the method includes the following steps:

S101, forming a first electrode 101 and a third electrode 201 on a base substrate 100 in a first region 10 and a second region 20 of each of the sub-pixel units 01 respectively; the first electrode 101 and the third electrode 201 both including an opaque metal layer;

S102, forming a first organic material functional layer 102 and a second organic material functional layer 202 in the first region 10 and the second region 20 respectively on the substrate formed with the first electrode 101 and the third electrode 201, and S103, forming a second electrode 103 and a fourth electrode 203 in the first region 10 and the second region 20 respectively on the substrate formed with the first organic material functional layer 102 and the second organic material functional layer 202, the second electrode 103 and the fourth electrode 203 both being translucent metal electrodes.

The first electrode 101, the first organic material functional layer 102 and the second electrode 103 constitute a first micro-cavity, the third electrode 201, the second organic material functional layer 202 and the fourth electrode 203 constitute a second micro-cavity, and the first micro-cavity and the second micro-cavity have different thicknesses.

Here, for example, the thickness of the first micro-cavity may be regulated by adjusting the thickness of the first electrode 101, and the thickness of the second micro-cavity may be regulated by adjusting the thickness of the third electrode 201.

As can be known from the above-mentioned relationship between the micro-cavity thickness and the wavelength of luminescent spectrum of micro-cavity, it is possible to change the position of emission mode order "m" and the emission wavelength of the micro-cavity by adjusting the thickness of the micro-cavity, thereby shifting the central wavelength of the electroluminescence spectrum, hence changing the light extraction efficiency. Therefore, in at least one embodiment of the present invention, the first region 10 and the second region 20 may have different light extraction efficiencies and viewing angle characteristics by adjusting the thicknesses of the first micro-cavity and the second micro-cavity. Thus, it is possible to implement regulation of the light extraction efficiency and viewing angle characteristics of the sub-pixel unit 01 by adjusting the ratio between the first region 10 and the second region 20 and the positions of them, thereby endowing the OLED display with the optimal light extraction efficiency and viewing angle characteristics.

Referring to FIG. 8, in each of the sub-pixel units 01, a thin film transistor 400 is further formed between the base substrate 100 and the first electrode 101 or the third electrode 201.

The thin film transistor 400 includes a gate electrode, a gate insulating layer, a semiconductor active layer, a source electrode and a drain electrode; and the drain electrode directly contacts the first electrode 101 or the third electrode 201.

At least one embodiment of the present invention further provides a manufacturing method of an OLED display including a plurality of sub-pixel units. Referring to FIGS. 3 to 5, the method includes the following steps:

S201, forming a first electrode 101 and a third electrode 201 on a base substrate 100 in a first region 10 and a second region 20 of each of the sub-pixel units 01 respectively; the first electrode 101 and the third electrode 201 both including an opaque metal layer, and the first electrode 101 having a planar top surface while the third electrode 201 having a non-planar top surface;

S202, forming a first organic material functional layer 102 and a second organic material functional layer 202 in the first region 10 and the second region 20 respectively on the substrate formed with the first electrode 101 and the third electrode 201;

S203, forming a second electrode 103 and a fourth electrode 203 in the first region 10 and the second region 20 respectively on the substrate formed with the first organic material functional layer 102 and the second organic material functional layer 202, the second electrode 103 and the fourth electrode 203 both being translucent metal electrodes.

The first electrode 101, the first organic material functional layer 102 and the second electrode 103 constitute a first micro-cavity, and the third electrode 201, the second organic material functional layer 202 and the fourth electrode 203 constitute a second micro-cavity.

In the embodiment of the present invention, by setting the top surface of the third electrode 201 to be non-planar, it is possible to enable the light emitted from the luminescent layer of the second organic material functional layer 202 to form multiple-beam interference in directions between the third electrode 201 and the fourth electrode 203, allowing light in different angles to exit and hence guaranteeing its viewing angle characteristics. While by setting the top surface of the first electrode 101 to be a plane, it can guarantee the intensity of the emitted light. By combining both of them, it is possible to achieve an optimal balanced state of the light extraction efficiency and the viewing angle characteristics of the sub-pixel unit 01, thereby endowing the OLED display with optimal light extraction efficiency and viewing angle characteristics.

Based on this, the process of setting the top surface of the third electrode 201 to be non-planar may be implemented in the following two ways.

The first way. As shown in FIG. 3, the top surface of the third electrode 201 that contacts the second organic material functional layer 202 is formed with certain roughness. The value of roughness may be set according to practical situations.

The second way. As shown in FIGS. 4 and 5, the top surface of the third electrode 201 that contacts the second organic material functional layer 202 is formed into an uneven shape. Here, the uneven shape may be for example of arcs, waves and corrugated shape.

Referring to FIGS. 6 and 7, the above-mentioned two cases may be implemented by forming a planarization layer 300 between the base substrate 100 and the first electrode 101 as well as the third electrode 201. That is, forming the planarization layer 300 specifically includes: forming a planarization layer film on the base substrate 100; and dry etching the planarization layer film such that the surface of the planarization layer film have roughness of a predetermined value or an uneven shape to form the planarization layer 300.

The material for the planarization layer film may be resin, and a corresponding dry etching gas may be selected to form a plasma atmosphere for etching the planarization layer film, thereby increasing its roughness or forming a particular shape in the second region 20.

Of course, it is also possible to control the shape of the planarization layer 300 in the second region 20 by the selection of heat treatment or drying process on the material itself.

In this process, it is required to guarantee the top surface of the planarization layer 300 in the first region 10 is a plane.

Referring to FIG. 9, in each of the sub-pixel units 01, a thin film transistor 400 is further formed between the base substrate 100 and the first electrode 101 or the third electrode 201.

The drain electrode of the thin film transistor 400 directly contacts the first electrode 101 or the third electrode 201.

The method of the above-mentioned embodiment allows the first micro-cavity and the second micro-cavity in one sub-pixel to have different micro-cavity effects.

What are described above is related to the illustrative embodiments of the disclosure only and not limitative to the scope of the disclosure; the scopes of the disclosure are defined by the accompanying claims.

The present application claims priority of a China patent application No. 201410171612.7 filed on Apr. 25, 2014, which is incorporated in its entirety herein by reference as part of the present application.

The invention claimed is:

1. An organic light-emitting diode (OLED) display comprising a plurality of sub-pixel units,
   wherein each of the sub-pixel units comprises a first region and a second region; the first region comprises a first electrode, a first organic material functional layer and a second electrode disposed in order on a base substrate; and the second region comprises a third electrode, a second organic material functional layer and a fourth electrode disposed in order on the base substrate;
   wherein both the first electrode and the third electrode comprise an opaque metal layer, and both the second electrode and the fourth electrode are translucent metal electrodes;
   the first electrode, the first organic material functional layer and the second electrode constitute a first micro-cavity, the third electrode, the second organic material functional layer and the fourth electrode constitute a second micro-cavity, and the first micro-cavity and the second micro-cavity have different micro-cavity effects;
   wherein the first electrode and the third electrode have different reflectivity; and
   wherein for the first micro-cavity, a top surface of the first electrode that contacts the first organic material functional layer is a plane; and for the second micro-cavity, a top surface of the third electrode that contacts the second organic material functional layer is a non-planar surface.

2. The OLED display of claim 1, wherein the first micro-cavity has a thickness different from that of the second micro-cavity.

3. The OLED display of claim 2, wherein each of the sub-pixel units further comprises a thin film transistor disposed between the base substrate and the first electrode or the third electrode.

4. The OLED display of claim 1, wherein the top surface of the third electrode that contacts the second organic material functional layer has roughness of a predetermined value.

5. The OLED display of claim 4, further comprising:
   a planarization layer disposed between the base substrate and the first electrode as well as the third electrode;
   wherein a top surface of the planarization layer under the third electrode has roughness of a predetermined value or an uneven shape.

6. The OLED display of claim 4, wherein each of the sub-pixel units further comprises a this film transistor disposed between the base substrate and the first electrode or the third electrode.

7. The OLED display of claim 1, wherein the top surface of the third electrode that contacts the second organic material functional layer has an uneven shape.

8. The OLED display of claim 7, further comprising:
a planarization layer disposed between the base substrate and the first electrode as well as the third electrode;
wherein a top surface of the planarization layer under the third electrode has roughness of a predetermined value or an uneven shape.

9. The OLED display of claim 7, wherein each of the sub-pixel units further comprises a thin film transistor disposed between the base substrate and the first electrode or the third electrode.

10. The OLED display of claim 1, wherein each of the sub-pixel units further comprises a thin film transistor disposed between the base substrate and the first electrode or the third electrode.

11. The OLED display of claim 10, wherein the first electrode and the third electrode are electrically connected, the second electrode and the fourth electrode are electrically connected; and
a drain electrode of the thin film transistor is electrically connected with the first electrode and the third electrode.

12. A manufacturing method of an organic light-emitting diode (OLED) display comprising a plurality of sub-pixel units, the method comprising:
forming a first electrode and a third electrode on a base substrate in a first region and a second region of each of the sub-pixel units respectively; the first electrode and the third electrode both comprising an opaque metal layer;
forming a first organic material functional layer and a second organic material functional layer in the first region and the second region respectively on the substrate formed with the first electrode and the third electrode, and
forming a second electrode and a fourth electrode in the first region and the second region respectively on the substrate formed with the first organic material functional layer and the second organic material functional layer, the second electrode and the fourth electrode both being translucent metal electrodes,
wherein the first electrode, the first organic material functional layer and the second electrode constitute a first micro-cavity, the third electrode, the second organic material functional layer and the fourth electrode constitute a second micro-cavity, and the first micro-cavity and the second micro-cavity have different thicknesses,
wherein the first electrode and the third electrode have differently reflectivity; and
wherein for the first micro-cavity, a top surface of the first electrode that contacts the first organic material functional layer is a plane; and for the second micro-cavity, a top surface of the third electrode that contacts the second organic material functional layer is a non-planar surface.

13. The method of claim 12, further comprising:
forming a thin film transistor between the base substrate and the first electrode or the third electrode in each of the sub-pixel units.

14. A manufacturing method of an organic light-emitting diode (OLED) display comprising a plurality of sub-pixel units, the method comprising:
forming a first electrode and a third electrode on a base substrate in a first region and a second region of each of the sub-pixel units respectively; the first electrode and the third electrode both comprising an opaque metal layer, and a top surface of the first electrode is a plane, a top surface of the third electrode is a non-planar surface;
forming a first organic material functional layer and a second organic material functional layer in the first region and the second region respectively on the substrate formed with the first electrode and the third electrode, and
forming a second electrode and a fourth electrode in the first region and the second region respectively on the substrate formed with the first organic material functional layer and the second organic material functional layer, the second electrode and the fourth electrode both being translucent metal electrodes,
wherein the first electrode, the first organic material functional layer and the second electrode constitute a first micro-cavity, the third electrode, the second organic material functional layer and the fourth electrode constitute a second micro-cavity.

15. The method of claim 14, wherein a top surface of the third electrode has roughness of a predetermined value or an uneven shape;
the method further comprising: forming a planarization layer between the base substrate and the first electrode as well as the third electrode;
wherein forming of the planarization layer comprises:
forming a planarization layer film on the base substrate;
dry etching the planarization layer film in the second region to allow a surface of the planarization layer film to have roughness of a predetermined value or an uneven shape, thereby forming the planarization layer.

16. The method of claim 15, further comprising:
forming a thin film transistor between the base substrate and the first electrode or the third electrode in each of the sub-pixel units.

17. The method of claim 14, further comprising:
forming a thin film transistor between the base substrate and the first electrode or the third electrode in each of the sub-pixel units.

* * * * *